United States Patent [19]

Hatabe

[11] Patent Number: 4,638,478
[45] Date of Patent: Jan. 20, 1987

[54] FRAME SYNCHRONIZING SYSTEM IN A RECEIVER IN A TIME-DIVISION MULTIPLEX TRANSMISSION SYSTEM

[75] Inventor: Michinori Hatabe, Kawasaki, Japan

[73] Assignee: Nitsuko Limited, Kawasaki, Japan

[21] Appl. No.: 747,722

[22] Filed: Jun. 21, 1985

[30] Foreign Application Priority Data

Jun. 21, 1984 [JP] Japan .................. 59-126327

[51] Int. Cl.[4] .................. H04J 3/26
[52] U.S. Cl. .................. 370/94; 370/101
[58] Field of Search .................. 370/94, 92, 89, 86, 370/101; 340/825.05, 825.07, 825.52

[56] References Cited

U.S. PATENT DOCUMENTS 4,471,481 9/1984 Shaw et al. .................. 370/101
4,516,239 5/1985 Maxemchuk .................. 370/94

Primary Examiner—Douglas W. Olms
Attorney, Agent, or Firm—Roberts, Spiecens & Cohen

[57] ABSTRACT

In a receiver receiving a time-division multiplex signal of a plurality of channels with each channel signal having a start signal part, an address signal, an error detecting code signal part, an information signal part, and a blank interval arranged in this order, a channel detecting circuit for detecting the channel signal assigned to the receiver is provided with a blank interval detecting circuit in addition to an address detecting circuit, in order to avoid an erroneous detection of the address detection circuit at a start condition of the receiver. Application of the multiplex signal to the address detecting circuit is prevented until the blank interval detection circuit initially detects one blank interval of the multiplex signal. At a start condition of the receiver, application of the multiplex signal to the address detecting circuit starts not at an intermediate time position in one channel signal but at the start signal part of a subsequent channel signal. The channel detecting circuit is further provided with a circuit for detecting an incorrect synchronization condition by observing the error detecting code signal part. The incorrect synchronization detecting circuit, when detecting the incorrectly synchronized condition, resets the blank interval detecting circuit into an initial condition, so that the acquisition operation of the frame synchronization is carried out. Thus, the frame synchronization is established even if noise invades the multiplex signal as transmitted.

11 Claims, 10 Drawing Figures

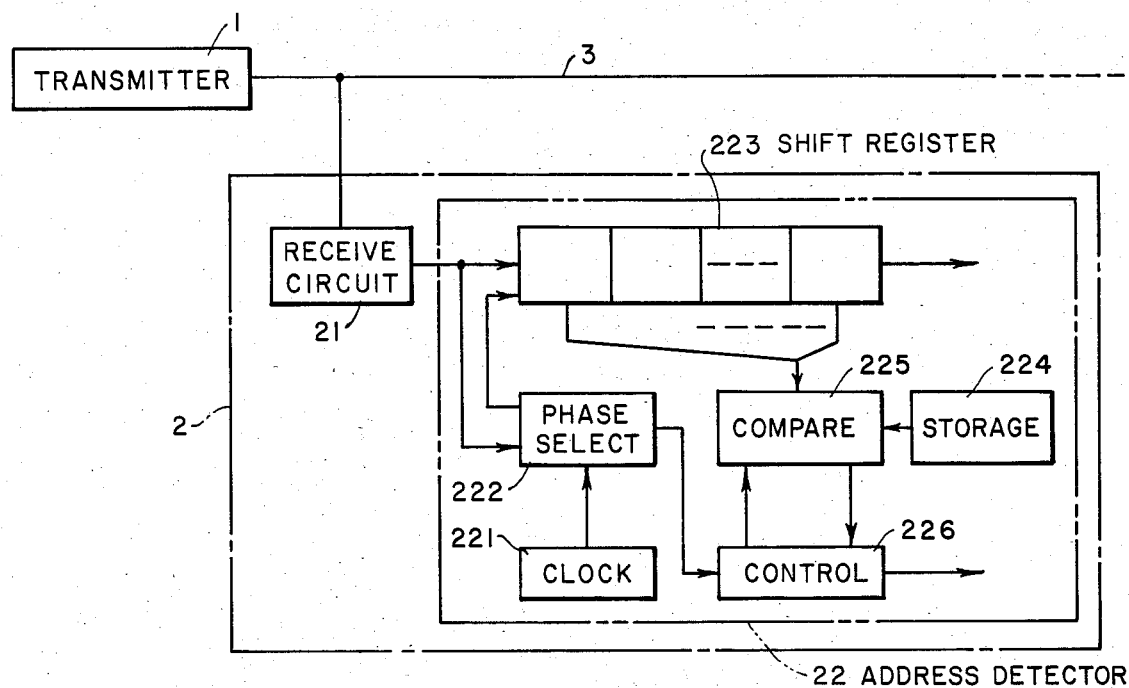
FIG. 1 (PRIOR ART)
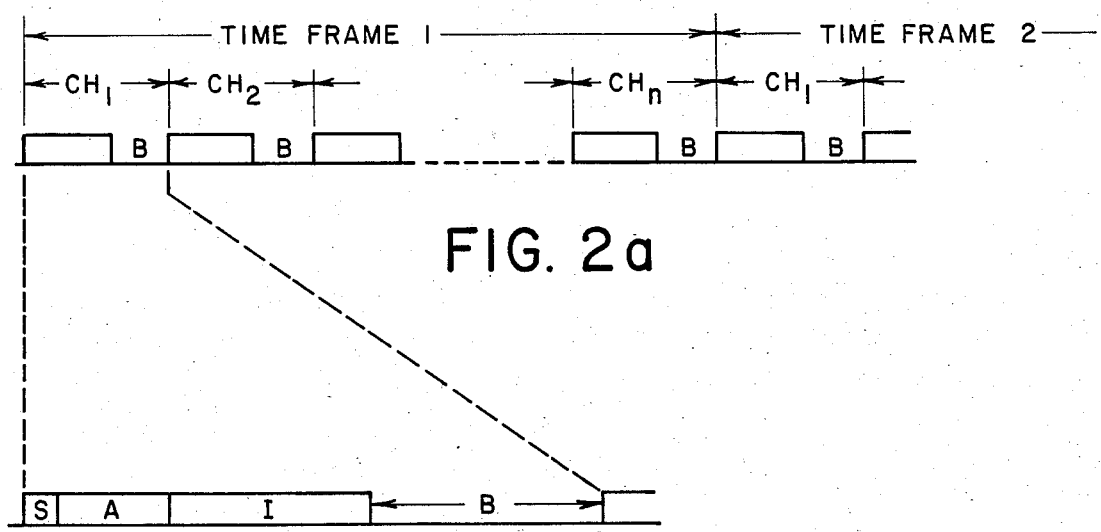
FIG. 2a
FIG. 2b

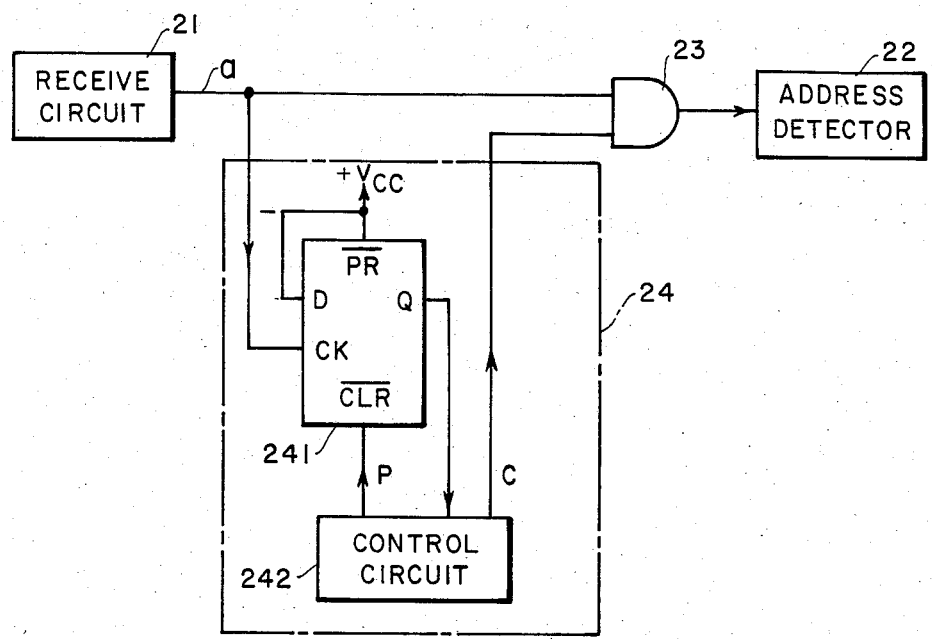
FIG. 3
| INPUT | | | | OUTPUT | |
|---|---|---|---|---|---|
| $\overline{PR}$ | $\overline{CLR}$ | CK | D | Q | |
| H | L | X | X | L | |
| H | H | ↑ | H | H | |
| H | H | L | X | $Q_0$ | |
FIG. 4
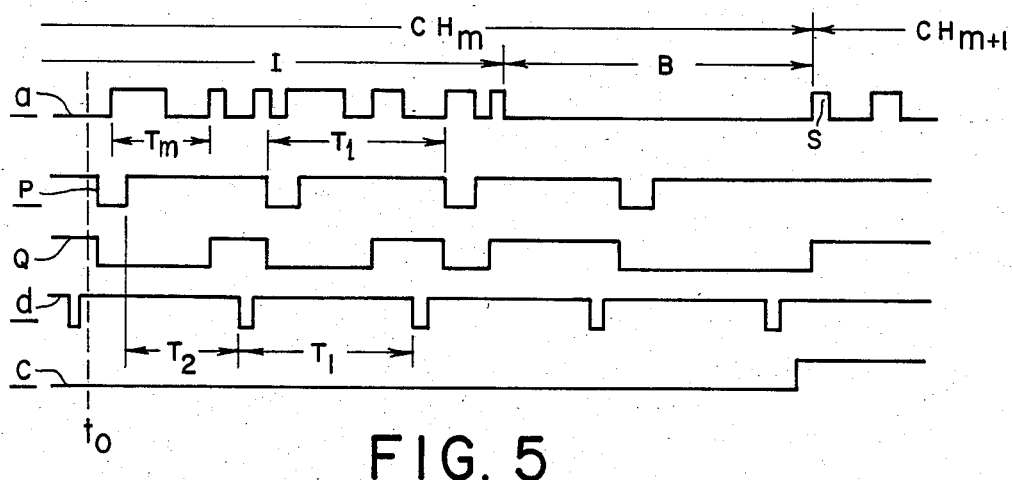
FIG. 5

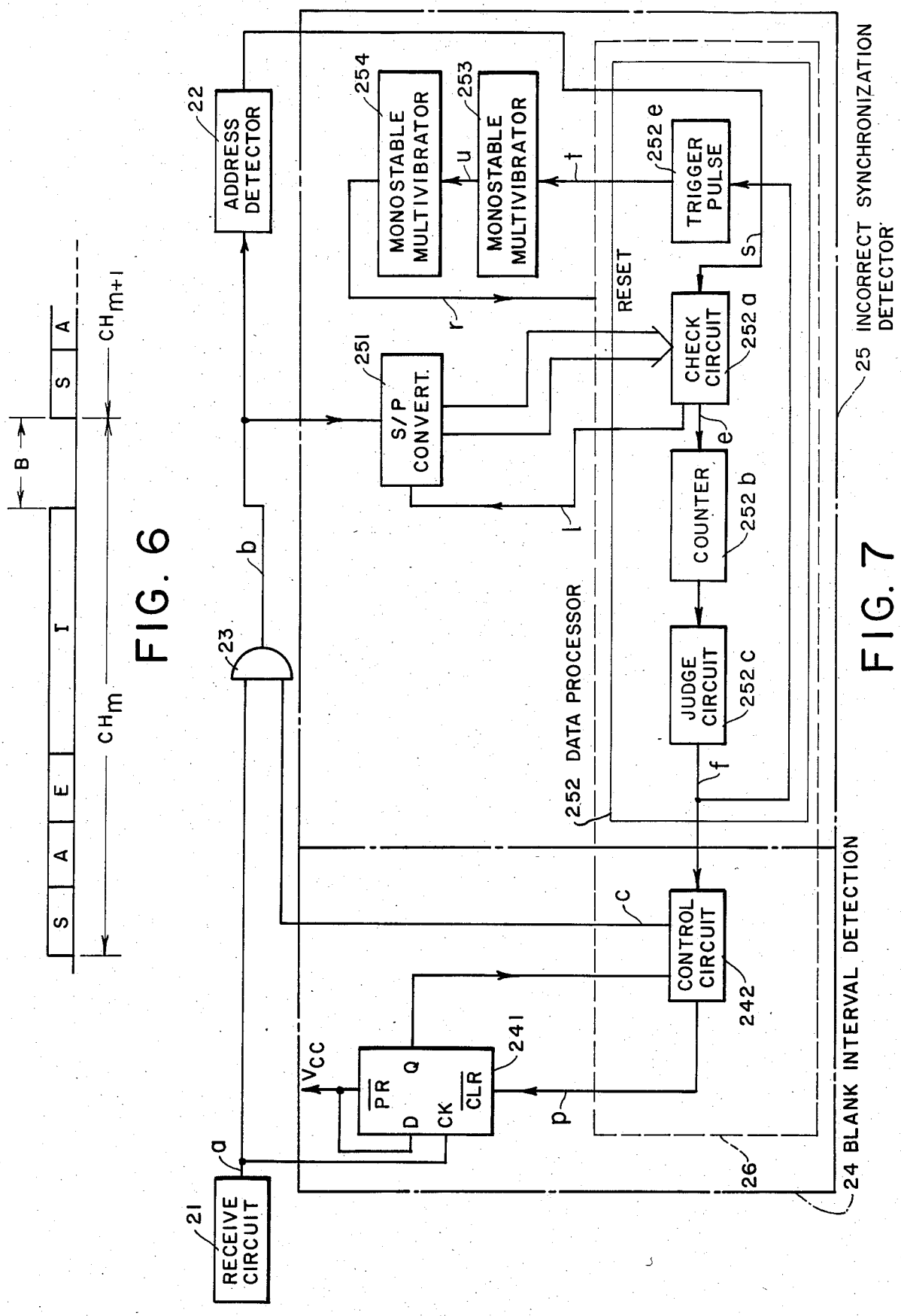

FRAME SYNCHRONIZING SYSTEM IN A RECEIVER IN A TIME-DIVISION MULTIPLEX TRANSMISSION SYSTEM

BACKGROUND OF THE INVENTION

1. Field of the Invention

The present invention relates to a time-division multiplex transmission system, and in particular, to a frame synchronizing system in a receiver in the system.

2. Description of the Prior Art

In order to transmit information to different receivers from a single transmitter through a common transmission line, a time-division multiplex transmission system is used.

In the time-division multiplex transmission system, a repetition period or a time frame is divided into a plurality of time slots which are used as channels for transmitting information to different receivers, respectively.

In a certain time-division multiplex signal, a digital signal in a time slot of a channel comprises a start signal part, an address signal part, an information signal part, and a blank interval which are arrayed in this order. The start signal part comprises a pulse signal corresponding to a start bit. The address signal part comprises a digital signal representing an address of a receiver corresponding to the channel. The information signal part comprises a digital data signal representing the information to be transmitted to a corresponding receiver. The blank interval is a space between the information signal part and the subsequent channel signal.

Each receiver in the time-division multiplex transmission system has a circuit for detecting the address signal corresponding thereto from the multiplex signal so as to detect the channel signal assigned thereto.

A known address detecting circuit comprises a storage device storing an address assigned to the receiver, and a comparing circuit comparing the address in the storage device with the signal received at the receiver. When the address is detected in the received signal by the comparison, the comparing circuit generates a detection signal. Then, the receiver can discriminate its channel signal from the multiplex signal.

The address detecting circuit starts its operation by reception of the start signal part and maintaining the operation during a time period equal to the total amount of time interval of the start signal part and another time interval of the address signal part. Once the address assigned to the receiver is detected in the received multiplex signal, the operation of the address detecting circuit is thereafter repeated at a constant interval equal to the time frame.

At a start condition of the system, or at a start condition of a receiver in the system, the initial pulse applied to the address detecting circuit drives the circuit as if it is a pulse of the start signal part, so that the operation of the address detecting circuit of the receiver starts at an indefinite time position of the time frame of the multiplex signal. There is a probability that an information signal part of each channel signal in the multiplex signal has a portion having the same signal pattern as the address signal part of the channel corresponding to the receiver. If the signal portion is applied to the address detecting circuit at the start condition, the address detecting circuit of the receiver erroneously detects the signal portion as the address signal part, so that the receiver cannot discriminate its channel signal from the multiplex signal. Namely, frame synchronization cannot be established in the receiver.

The present inventor already proposed a resolution of the problem in a copending patent application Ser. No. 715,509 filed on Mar. 25, 1985, which was assigned to the same assignee.

A channel detecting circuit proposed in the copending application is provided with a blank interval detecting circuit in addition to an address detecting circuit. Application of the multiplex signal to the address detecting circuit is prevented until the blank interval detection circuit initially detects one blank interval of the multiplex signal. At a start condition of the receiver, application of the multiplex signal to the address detecting circuit starts at not at an intermediate time position in one channel signal but the start signal part of a subsequent channel signal.

However, the channel detecting circuit proposed by the copending application cannot avoid an erroneous frame synchronization due to noise in the multiplex signal as transmitted.

SUMMARY OF THE INVENTION

It is an object of the present invention to provide a frame synchronizing system in a receiver in a time-division multiplex transmission system wherein a frame synchronization can be reliably achieved even if the synchronization is has interfering noise.

As described above, a known receiver in a time-division multiplex transmission system comprises an address detecting circuit for detecting an address signal assigned to the receiver in the multiplex signal in order to discriminate its channel signal in the multiplex signal.

The present invention is applicable for receiving a time-division multiplex signal having a plurality of channels corresponding to a plurality of receivers, each channel signal comprising a start signal part corresponding to a start bit, an address signal part representing an address assigned to a corresponding receiver, an error detecting code signal part, an information signal part representing information to be transmitted to the corresponding receiver, and a blank interval.

According to the present invention, a frame synchronizing system in a receiver comprises the address detecting circuit, blank interval detecting means for detecting the blank interval in each channel signal in the multiplex signal, gate means for blocking the multiplex signal from being transmitted to the address detecting circuit but permitting the multiplex signal to be transmitted to the address detecting circuit once the blank interval is detected by the blank interval detecting means, and incorrect synchronization detecting means for detecting an incorrect synchronization due to the error detecting code signal after reception of a channel detection signal from the address detecting circuit, the incorrect synchronization detecting means generating an incorrect synchronization signal to reset the blank interval detecting means into an initial condition.

According to the present invention. when the receiving operation of the receiver starts, application of the multiplex signal to the address detecting circuit does not start at an intermediate time position of any one channel signal but starts at the beginning of a channel signal. Therefore, operation of the address detecting circuit and each channel signal are synchronized with each other, so that erroneous channel detection can be avoided. Further, if the multiplex signal is interfered with noise so that an erroneous synchronization is established, this is detected by the incorrect synchronization detecting means, and the blank interval detecting means is reset into the initial condition. Therefore, reacquisition of synchronization can be carried out.

The incorrect synchronization detecting means comprises serial-parallel converting means for converting a time-serial signal from the gate means, and checking means driven by reception of the channel detection signal from the address detecting circuit. The checking means provides a latching signal to the serial-parallel converting means after a predetermined time period equal to a time period of the error detecting code signal from the reception of the channel detection signal. The serial-parallel converting means latches a current parallel-converted signal in response to the latching signal. The checking means checks that the latched signal does not coincide with the error detecting code signal, and provides an error signal. The incorrect synchronization signal is produced on the base of the error signal.

The incorrect synchronization detecting means further comprises a counter means for counting the error signal, and judging means for judging whether the incorrect synchronization is established or not. The judging means generates the incorrect synchronization signal at a time when the content of the counter means exceeds a predetermined value. Then, the blank interval detecting means is reset by the incorrect synchronization signal to the initial condition.

Further objects and features of the present invention will be understood from the following detailed description of preferred embodiments referring to the accompanying drawings.

BRIEF DESCRIPTION OF THE DRAWINGS

FIG. 1 is a schematic view illustrating a transmission system with a receiver having a known address detecting circuit;

FIG. 2a is a schematic view illustrating a time frame of a multiplex signal in a time-division multiplex transmission system to which the present invention is applied;

FIG. 2b is an enlarged view of one channel signal in the multiplex signal;

FIG. 3 is a schematic view of a channel detecting circuit as proposed in the above-described copending application;

FIG. 4 is a view illustrating a function table of a D-type flip-flop circuit used in the embodiment;

FIG. 5 is a view illustrating signal waveforms at various points in the circuit of FIG. 3;

FIG. 6 is a view illustrating a format of a channel signal of a multiplex signal to which the present invention is applicable;

FIG. 7 is a schematic view of an embodiment according to the present invention;

DETAILED DESCRIPTION OF PREFERRED EMBODIMENTS

Figure 8:
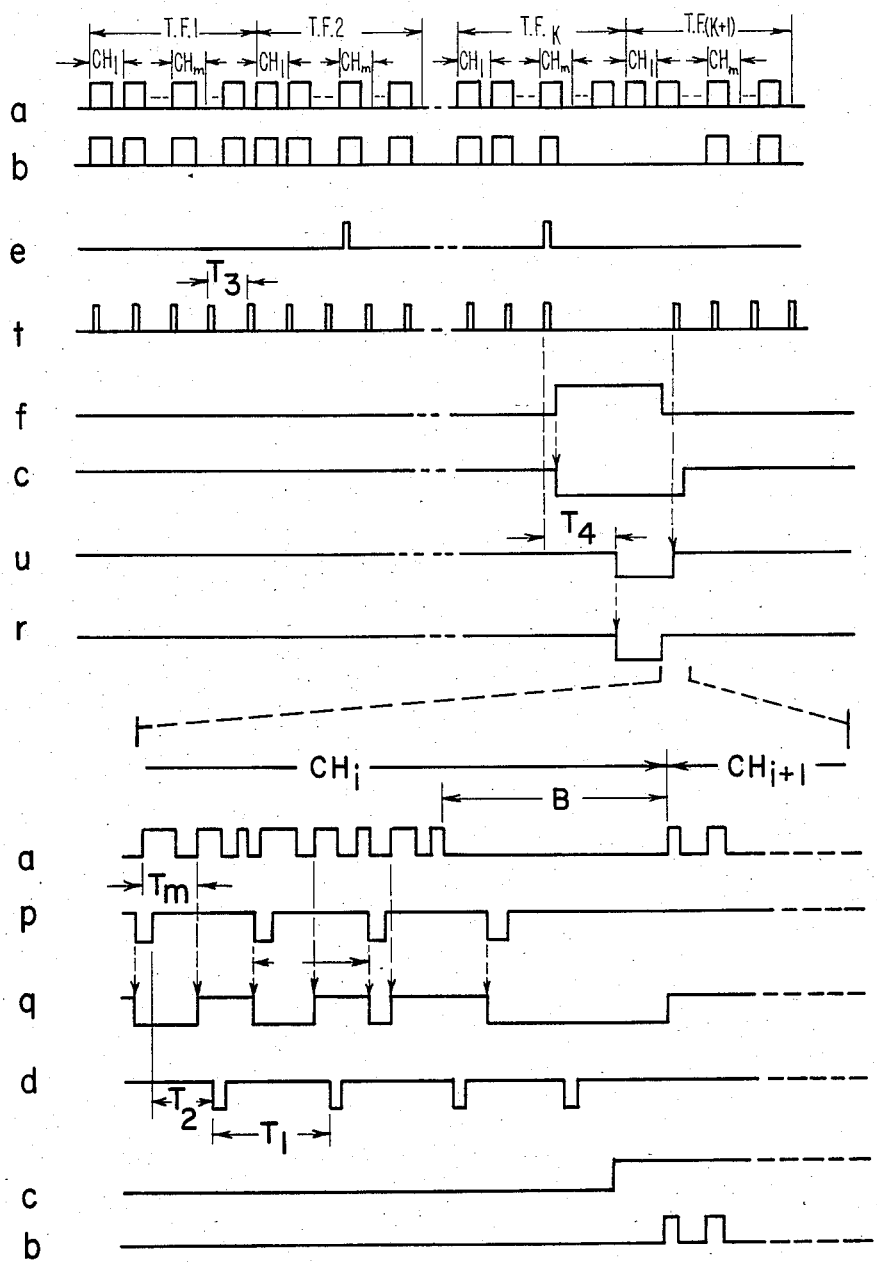
FIG. 8 is a view illustrating signal waveforms at various points in the circuit of FIG. 7.

Referring to FIG. 1, in case it is desired to transmit digital information from a transmitter 1 to a plurality of receivers (one of which is shown at 2 in the figure) through a common transmission line 3, a time-division multiplex transmission system is used.

Referring to FIG. 2a, a time-division multiplex signal in the system has a repetition time period or a time frame. Each time frame is divided into a plurality of (n) time slots which are used as n channels for n receivers.

Referring to FIG. 2b in addition to FIG. 2a, a channel signal assigned to each time slot comprises a start signal part S representing a start bit, an address signal part A representing an address allotted to the channel, an information signal part I representing information to be transmitted to the corresponding receiver, and a blank interval B, which are arrayed in this order in the time slot, as shown in FIG. 2b.

In the prior art, receiver 2 has a receiver circuit 21 which regenerates the multiplex signal from a signal transmitted through transmission line 3. The regenerated multiplex signal is applied to an address detecting circuit 22 to discriminate the channel signal assigned to the receiver 2 from the other channel signals.

Address detecting circuit 22 comprises a clock pulse generator 221 generating a multiphase clock pulse, a clock phase selector 222 for selecting a clock pulse synchronized with the multiplex signal from receiving circuit 21 at reception of the start signal part S, and a shift register 223. The digital signal of the multiplex signal from receiving circuit 21 is registered in shift register 223 by control of the clock pulse selected from clock phase selector 222. A number of stages of shift register 223 is determined to be equal to the bit number of the start signal part S and the address signal part A.

The address detecting circuit 22 also has an address storage device 224 storing an address assigned to the receiver 2. Address storage device 224 is preferably a type to which a desired address can be preset, for example, by means of a rotary switch.

The address stored in storage device 224 is applied to a comparator 225 and compared with the data registered in shift register 223. When the data and the address coincide with each other, the comparator 225 generates a coincidence signal to a control circuit 226. Thus, the address signal part of the channel assigned to the receiver 2 is detected. Control circuit 226 generates a channel detection signal in response to the coincidence signal to a circuit (not shown) for deriving the information signal part subsequent to the address signal part. Simultaneously, control circuit 226 generates a stop signal to comparator 225.

Thereafter, control circuit 226 drives comparator 225 at a constant time interval equal to the time frame so that the above-described address detection operation is repeated. As a result, the frame synchronization is acquired and the channel assigned to the receiver is discriminated from the other channels.

As described hereinbefore, the address detecting circuit sometimes carries out erroneous detection at a start condition of the receiving operation of the receiver.

In order to avoid the erroneous frame synchronization, the above-described copending application discloses a channel detecting circuit, which will be described below referring to FIGS. 3-5.

Referring to FIG. 3, an AND gate 23 is provided in a transmission path from the receiving circuit 21 to the address circuit 22, according to the present invention. An input terminal of AND gate 23 is connected to an output of receiving circuit 21 and an output terminal of AND gate 23 is connected to an input of address detecting circuit 22. A blank interval detecting circuit 24 is connected to the other input terminal of AND gate 23. Accordingly, when no blank interval detection signal is applied to AND gate 23, the multiplex signal is not transmitted from receiving circuit 21 to address detection circuit 22.

The blank interval detection circuit 24 is a circuit for detecting the blank interval (B in FIGS. 2a and 2b) in the multiplex signal. When blank interval detection circuit 24 detects one blank interval B in the multiplex signal from receiving circuit 21, the circuit 24 generates a blank interval detection signal. The blank interval detection signal is applied to AND gate 23 to open the gate.

Once the blank interval is detected, the blank interval detection signal is maintained thereafter, while further time interval detection operation is stopped.

Therefore, application of the multiplex signal from receiving circuit 21 to address detecting circuit 22 starts at the start signal part of one channel signal of the multiplex signal. Therefore, erroneous channel detection can be avoided at a start condition of the receiver.

An example of the blank interval detecting circuit 24 comprises a trigger circuit of a delayed (D-type) flip-flop circuit 241 and a control circuit 242.

D-type flip-flop circuit has a clock input terminal CK connected to the output of receiving circuit 21, a data input terminal D maintained at a high level ("H" level) voltage of +Vcc, a preset input terminal $\overline{PR}$ maintained at "H" level of +Vcc, a clear pulse input terminal $\overline{CLR}$ connected to control circuit 242, and an output terminal Q connected to control circuit 242.

A relationship between each input signal and the output signal to the D-type flip-flop is shown in the function table in FIG. 4.

The following symbols are used in the function table in FIG. 4:

H=high level (steady state)
L=low level (steady state)
↑ =irrelevant (any input, including transitions)
Qo=level of Q before the indicated steady state input conditions were established.

Control circuit 242 provides a control pulse of a low level ("L" level) at a constant time interval to $\overline{CLR}$ terminal and checks the signal level at the Q terminal at the same time interval but spaced from the control pulse.

When control circuit 242 detects "L" level signal at the Q terminal in a checking operation, control circuit 242 generates the blank interval detection signal, which is applied to AND gate 23. Thereafter, the control circuit 242 stops the generation of the control pulse and the checking operation while maintaining the blank interval detection signal.

Referring to FIG. 5, the operation of the blank interval detection circuit 24 will be described below.

When the receiver starts at a time $t_o$, it is provided that the output of receiving circuit 21 starts at an intermediate time position of the information signal part I in one channel signal CHm of the multiplex signal a.

Control circuit 242 also starts at the time $t_o$ to generate the control signal p at a constant interval $T_1$ and to perform the checking operation as shown at d in FIG. 5.

Since the multiplex signal a and the control pulse p are applied to the CK terminal and the $\overline{CLR}$ terminal of the D-type flip-flop circuit 241, respectively, and since the input signals and the output signal of the D-type flip-flop circuit 241 have the relationship illustrated in FIG. 4, the output level at the Q terminal varies in the manner as shown at Q in FIG. 5.

As will be noted from multiplex signal a, output signal Q, and checking signal d, a time duration when the Q output signal is maintained at the "L" level is increased at a period of the blank interval B so that the "L" level of the Q output signal is detected. Thus, the control circuit 242 generates the blank interval detection signal as shown at c in FIG. 5.

AND gate 23 is opened by the blank interval detection signal, so that application of the muliplex signal a to the address detecting circuit 22 starts at the start signal part S of the next channel signal CH$_{m+1}$.

In order that the blank interval is reliably detected, the constant time interval $T_1$ should be determined to satisfy the following relationship;

$$T_m < T_1 < B/2$$

where Tm is the maximum time space between a transition point from a low level to a high level and the next transition point from a low level to a high level in the multiplex signal, and B is the blank interval.

The checking signal d is generated the same interval $T_1$ but is spaced from the control signal p by a time duration $T_2$.

In the circuit of FIG. 3, if a noise pulses exist during a blank period after gate circuit 23 is open, or if the bit pattern of the start signal part S and the address signal part A of the channel subsequent to the blank period is changed by invasion of noise, correct frame synchronization cannot be acquired.

In order to resolve the problem, the present invention provides a receiver comprising an incorrect synchronization detecting circuit in addition to the blank interval detecting circuit.

Referring to FIG. 6, the present invention is applicable to a time-division multiplex transmission system wherein each channel signal comprises a start signal part S corresponding to a start bit, an address signal part A representing an address assigned to a corresponding receiver, an error detecting code signal part E, an information signal part I representing information to be transmitted to the corresponding receiver, and blank interval B.

Referring to FIG. 7, a receiver of an embodiment of the present invention shown therein comprises a receiving circuit 21, an address detection circuit 22, a gate circuit 23, a blank interval detecting circuit 24, and an incorrect synchronization detecting circuit 25.

Receiving circuit 21 and address detecting circuit 22 are similar to those in FIG. 1 and FIG. 3, and gate circuit 23 and blank interval detecting circuit 24 are similar to those in FIG. 3. Therefore, description of arrangements and operation of them will be omitted for the purpose of simplification of the description.

Incorrect synchronization detecting circuit 25 comprises a serial-parallel converter 251 for converting a time-serial digital signal (b) outputted from gate circuit 23 into a time-parallel digital signal, a data processor 252, a retriggerable mono-stable multivibrator 253 triggered by trigger pulse (t) provided from data processor 252, and another retriggerable mono-stable multivibrator 254. Multivibrator 254 is triggered by a descending edge of the output (u) from multivibrator 253 and generates a reset pulse (r) for data processor 252.

Data processor 252 comprises a checking circuit 252a. The checking circuit 252a receives the channel detection signal (s) from address detecting circuit 22 and generates, after a predetermined time period, a latching pulse (1) for serial-parallel converter 251, which, in turn, latches the current parallel signal. Checking circuit 252a receives the latched parallel signal and checks whether the latched parallel signal coincides with the error detecting code signal E or not. When no coincidence is found, checking circuit 252a generates an error signal (e).

Data processor 252 further comprises a counter 252b for counting the error signal (e) from checking circuit 252a, and a judging circuit 252c for judging an incorrect synchronization due to the content of counter 252b. When judging circuit 252c judges the incorrect synchronization, it provides an incorrect synchronization signal (f) to control circuit 242 of blank interval detecting circuit 24.

When receiving the incorrect synchronization signal (f), control circuit 242 stops to generate the blank interval detection signal (c).

The data processor 252 further comprises a trigger pulse generator 252e which generates trigger pulses (t) for multivibrator 252 at a predetermined pulse repetition interval ($T_3$ as shown in FIG. 8) which is smaller than an astable time period ($T_4$ as shown in FIG. 8) of multivibrator 253.

Trigger pulse generator 252e is controlled by the incorrect synchronization signal (f) to stop the trigger pulse generating operation.

In the shown embodiment, control circuit 242 and data processor 252 are embodied by a single micro processor 26. If the control circuit 242 is made separate from the data processor 252, the reset pulse (r) from multivibrator 254 is also applied to control circuit 242 so as to reset the control circuit into an initial condition.

Acquisition operation of synchronization in the receiver will be described below.

A. Initial Acquisition

When the receiver starts, all of the circuits of the receiver are initiallized or reset to an initial condition in a conventional manner. Then, blank interval detecting circuit 24 operates in the manner as described above in connection with FIGS. 3–5.

During the operation of blank interval detecting circuit 24, trigger pulses (t) are generated from trigger pulse generator 252e, and mono-stable multivibrator 253 is triggered repeatedly to maintain a high level output. Accordingly, the output (r) of mono-stable multivibrator 254 is also maintained at a high level, so that no reset pulse is generated at multivibrator 254.

Since no channel detection signal (s) is applied to checking circuit 252a, the checking circuit generates no output signal. The content of counter 252b is maintained at zero. Therefore, no incorrect synchronization signal is provided from judging circuit 252c.

When the channel detection signal (s) is outputted from address detecting circuit 22 after gate circuit 23 is opened by blank interval detection circuit 24, checking circuit 252a is driven by the channel detection signal (s).

Checking circuit 252a provides the latching signal (1) to serial-parallel converter 251 after a predetermined time period from reception of the channel detection signal (s). The predetermined time period is selected to be a time period equal to a time period during which the error detecting code signal part E is maintained in the channel signal.

After gate circuit 23 is open, the received signal is supplied not only to address detecting circuit 22 but also serial-parallel converter 251. When serial-parallel converter 251 receives the latching signal (1), it latches the current parallel signal, which is, in turn, checked up at checking circuit 252a.

If address detecting circuit 22 detects the correct address signal part A so that the frame synchronization is acquired, the latched parallel signal coincides with the error detecting code signal. But, when the former does not coincide with the latter, the correct frame synchronization is not acquired. Then, the acquisition operation of frame synchronization must be carried out again.

B. Reacquisition of Sycnhronization

When the parallel signal latched at serial-parallel converter 251 does not coincide with the predetermined error detecting code signal E, the error signal (e) is provided to counter 252b from checking circuit 252a.

The error signal (e) is generated at time intervals of a time frame as shown in FIG. 8.

Counter 252b counts the error signal (s) inputted thereto at the time frame intervals. If the error signal (s) is not applied to counter 252b at a certain frame interval, the content of the counter is reset to zero.

When the content of counter 252b exceeds a predetermined count value, judging circuit 252c judges that the incorrect synchronization is established, and generates the incorrect synchronization signal (f), that is, the output signal of judging circuit 252c changes from a low level to a high level, as shown in FIG. 8. Therefore, control circuit 242 operates to change the blank interval detection signal (c) from a high level to low level, so that gate circuit 23 is closed, as shown in FIG. 8.

At that time, trigger pulse generator 252e stops to generate the trigger pulses (t), as shown in FIG. 8. Therefore, the output (u) of multivibrator 253 is changed to a low level, as shown in FIG. 8. Accordingly, control circuit 242 and data processor 252 are reset to the initial condition. Then, an operation similar to the initial acquisition as described above is carried out as shown at the lower waveforms a-b in FIG. 8.

Thus, the reacquisition of synchronization is carried out until the correct frame synchronization can be established.

Figure 9:
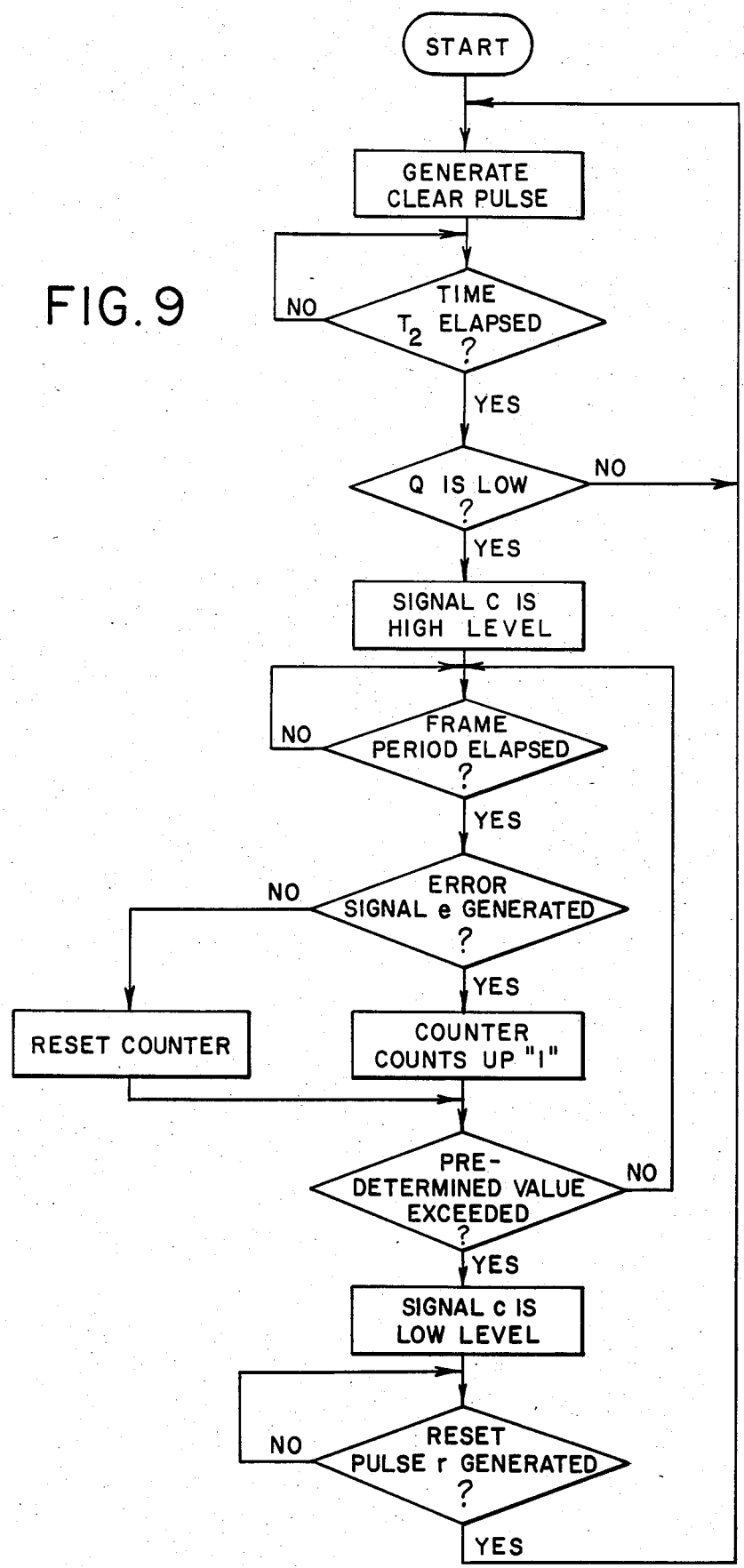
FIG. 9 is a flow chart illustrating control steps of a microprocessor in the circuit of FIG. 7.

A flow chart of the control operation of microprocessor 26 is illustrated in FIG. 9 for carrying out the initial acquisition and the reacquisition of the frame synchronization.

In the above-described embodiment, the microprocessor is not reset to the initial condition directly by the incorrect synchronization signal (f) but is reset by the reset pulse (r) from multivibrator 254. This is for reliably resetting the microprocessor 26 at a time not only when reacquisition is required but also when the microprocessor runs out. However, the trigger pulse generator 252e and two multi-vibrators 253 and 254 can be omitted. In that case, the microprocessor 26 should be reset by the incorrect synchronization signal (f).

With respect to counter 252b, a reversible counter can be used which counts the error signal (e) but counts down at a time when the error signal is not supplied at the time frame interval.

Judging circuit 252c may be a type which resets the counter 252b at a predetermined number of time frame intervals and judges the incorrect synchronization based on the ratio of the content of the counter to the predetermined number of time frame intervals.

The error detecting code signal E usually has a fixed pattern which is stored in a memory in checking circuit 252a, and is compared with the signal latched in serial-parallel converter 251. However, the error detecting code signal is a variable code which changes according to a predetermined regulation in subsequent time frames. In that case, the check circuit 252a must have a memory storing the variation of the predetermined regulation.

What is claimed is:

1. In a frame synchronizing system is a receiver receiving a time-division multiplex signal having a plurality of channels corresponding to a plurality of receivers, each channel signal comprising a start signal part correspoding to a start bit, an address signal part representing an address assigned to a corresponding receiver, an error detecting code signal part, an information signal part representing information to be transmitted to a corresponding receiver, and a blank interval, said frame synchronizating system comprising an address detecting means detecting the address signal part of the channel signal correspon to the receiver in the multiplex signal to generate a channel detection signal, the improvement which comprises means detecting said blank interval in the time-division multiplex signal received at the receiver, said blank interval detecting means generating a blank interval detection signal at a time when said blank interval is detected, said blank interval detection signal being maintained after first detection of said blank interval, gate means for blocking transmission of the multiplex signal to said address detecting circuit but permitting the multiplex signal to be transmitted to said address detecting circuit in response to said blank interval detection signal from said blank interval detecting means, and incorrect synchronization detecting means for detecting incorrect synchronization due to production of said error detecting code signal after reception of said channel detection signal from said address detecting means, said incorrect synchronization detecting means generating an incorrect synchronization signal to reset said blank interval detecting means to an initial condition.

2. The frame synchronizing system as claimed in claim 1, wherein said address detecting means comprises address storage means storing the address assigned to the receiver, shift register means storing signal elements of the multiplex signal inputted thereto, and comparing means comprising said address stored in said address storage means with the content in said shift register means, said comparing means generating said channel detection signal at a time when said address and said content coincide with each other.

3. The frame synchronization system as claimed in claim 1, wherein said blank interval detecting means comprises a trigger circuit having an input terminal to which the multiplex signal is applied, a control terminal to which a control pulse is applied, and an output terminal, said trigger circuit operating so that said output terminal is maintained at a low level during a time period when said control terminal is at a low level, but is changed to a high level in response to a transition of said input terminal from a low level to a high level and is maintained at the high level thereafter during a time period when said control terminal is at a high level, and a control circuit generating the control pulse of a low level at a constant time interval and checking the signal level at said output terminal at the same time interval but spaced from the control pulse by a predetermined time duration, said control circuit generating the blank interval detection signal at a time when the low level signal is observed on said output terminal by the checking operation, and thereafter stopping the generation of the control pulse and the checking operation.

4. The frame synchronizing system as claimed in claim 3, wherein said trigger circuit is a delayed flip-flop circuit having a clock input terminal (CK) to which the multiplex signal is applied, a data input terminal (D) maintained at a high level, a preset input terminal ($\overline{PR}$) maintained at a high level, a clear input terminal ($\overline{CLR}$) to which said control pulse is applied and an output terminal (Q).

5. The frame synchronizing system as claimed in claim 3, wherein said constant time interval is smaller than one second of said blank interval.

6. The frame synchronizing system as claimed in claim 5, wherein said constant time interval is determined to be larger than the maximum time space between a transition point from a low level to a high level and the next transition point from a low level to a high level in the multiplex signal.

7. The frame synchronizing system as claimed in claim 1, wherein said gate means is an AND gate having two input terminals, and an output terminal.

8. The frame synchronizing system as claimed in claim 1, wherein said incorrect synchronization detecting means comprises serial-parallel converting means for converting a time-serial digital signal from said gate means, and checking means driven by reception of said channel detection signal from said address detecting means, said checking means providing a latching signal to said serial-parallel converting means after a predetermined time period equal to a time period of said error detecting code signal from said reception of said channel detection signal, said serial-parallel converting means latching a current parallel converted signal in response to said latching signal, said checking means checking that the latched signal does not coincide with the error detecting code signal and providing an error signal, said incorrect synchronization signal being produced on the base of said error signal.

9. The frame synchronizing system as claimed in claim 8, wherein said incorrect synchronization detecting means further comprises counter means for counting said error signal at the time frame intervals, and judging means for judging the incorrect synchronization due to the content in said counter means and providing said incorrect synchronization signal.

10. The frame synchronizing system as claimed in claim 9, wherein said incorrect synchronization detecting means further comprises reset pulse generating means for generating a reset pulse in response to said incorrect synchronization signal, said reset pulse being applied to said blank interval detecting circuit to thereby reset said blank interval detecting circuit into an initial condition.

11. The frame synchronizing system as claimed in claim 10, wherein said reset pulse generating means comprises first retriggerable mono-stable multivibrating means, trigger pulse generating means for generating trigger pulses for said first multivibrating means at a pulse interval smaller than a time period of said first multivibrating means, said trigger pulse generating means being controlled to stop incorrect synchronization signal to stop its trigger pulse generating operation, and second retriggerable mono-stable multivibrating means which is triggerred by a descending edge of an output signal of said first multivibrating means to provide said reset signal.

* * * * *